United States Patent
Cho et al.

(10) Patent No.: US 9,356,594 B2
(45) Date of Patent: May 31, 2016

(54) SWITCHED-MODE POWER SUPPLY USING VARIABLE BIAS CURRENT

(71) Applicant: SAMSUNG ELECTRO-MECHANICS CO., LTD., Suwon, Gyunggi-do (KR)

(72) Inventors: Hwan Cho, Gyunggi-do (KR); Jung Hyun Kim, Gyunggi-do (KR); Jung Chul Gong, Gyunggi-do (KR)

(73) Assignee: SOLUM CO., LTD., Suwon-Si, Gyeonggi-Do (KR)

( * ) Notice: Subject to any disclaimer, the term of this patent is extended or adjusted under 35 U.S.C. 154(b) by 436 days.

(21) Appl. No.: 14/035,315

(22) Filed: Sep. 24, 2013

(65) Prior Publication Data

US 2015/0002122 A1    Jan. 1, 2015

(30) Foreign Application Priority Data

Jun. 28, 2013    (KR) .................. 10-2013-0075753

(51) Int. Cl.
*G05F 1/46*    (2006.01)
*H03K 17/16*    (2006.01)

(52) U.S. Cl.
CPC .............. *H03K 17/163* (2013.01); *G05F 1/462* (2013.01)

(58) Field of Classification Search
CPC .......... H02M 3/156; G05F 1/46; G05F 1/462; G05F 1/56; G05F 1/565
See application file for complete search history.

(56) References Cited

U.S. PATENT DOCUMENTS

| 5,783,972 | A | 7/1998 | Nishikawa | |
|---|---|---|---|---|
| 6,147,883 | A * | 11/2000 | Balakrishnan | .... H02M 3/33507 323/315 |
| 9,246,384 | B2 * | 1/2016 | Liu | ........ H02M 3/156 |
| 2006/0244498 | A1 | 11/2006 | Kohout et al. | |
| 2009/0028235 | A1 | 1/2009 | Park et al. | |
| 2009/0322391 | A1 | 12/2009 | Lee et al. | |
| 2012/0020134 | A1 | 1/2012 | Lee et al. | |
| 2012/0256610 | A1 * | 10/2012 | D'Angelo | ............... G05F 3/262 323/284 |

FOREIGN PATENT DOCUMENTS

| JP | 09-153796 A | 6/1997 |
|---|---|---|
| KR | 10-2009-0011485 A | 2/2009 |
| KR | 10-2010-0001227 A | 1/2010 |
| KR | 10-2012-0010139 A | 2/2012 |

* cited by examiner

*Primary Examiner* — Matthew Nguyen
(74) *Attorney, Agent, or Firm* — McDermott Will & Emery LLP

(57) ABSTRACT

There is provided a switched-mode power supply including: a PWM control unit generating a clock signal having pulse widths of the clock depending on a load to provide a path switching signal; a clock counter counting the clock signal to generate a control signal; a current source generating a current; a current mirroring circuit unit having a plurality of upper side current mirroring units respectively mirroring the current from the current source to create a current having a predetermined amplitude; a first current adjusting unit individually selecting a portion of the plurality of upper side current mirroring units according to the control signal; and a path switching circuit unit switched according to the path switching signal so as to select a charging path between the first current adjusting unit and a power switch or a discharging path between the power switch and the ground.

34 Claims, 11 Drawing Sheets

SWITCHED-MODE POWER SUPPLY USING VARIABLE BIAS CURRENT

CROSS-REFERENCE TO RELATED APPLICATIONS

This application claims the priority of Korean Patent Application No. 10-2013-0075753 filed on Jun. 28, 2013, in the Korean Intellectual Property Office, the disclosure of which is incorporated herein by reference.

BACKGROUND OF THE INVENTION

1. Field of the Invention

The present invention relates to a switched-mode power supply using a variable bias current.

2. Description of the Related Art

In general, a power supply such as an adapter or a switched-mode power supply (SMPS) includes a power switch for performing power conversion depending on a load condition using pulse width modulation (hereinafter referred to as "PWM").

Typically, a power supply includes a power switch receiving a rectified input voltage to generate an output voltage of a level desired by a user by being switched on or off, and an operating circuit generating an operating signal for driving the power switch.

In existing power supplies, a PWM signal having a regular period is used as the driving signal for the power switch.

In such a power switch operated by such a PWM signal, switching noise may occur during switching, and devices around the power switch may be adversely affected.

Patent Document 1 relates to a switching control device, a power supply device comprising the same, and a switching control method. However, according to the disclosure in Patent Document 1, a bias current cannot be periodically varied; and, therefore, Patent Document 1 does not disclose the features of reducing switching noise and improving electromagnetic interference (hereinafter referred to as "EMI") characteristics by varying a bias current.

RELATED ART DOCUMENT (Patent Document 1) Korean Patent Laid-Open Publication No. 2012-0010139

SUMMARY OF THE INVENTION

An aspect of the present invention provides a switched-mode power supply capable of reducing switching noise and thereby improving EMI characteristics by periodically varying a bias current.

According to an aspect of the present invention, there is provided a switched-mode power supply including: a PWM control unit generating a predetermined clock signal and varying pulse widths of the clock signal depending on a load to provide a path switching signal; a clock counter counting the clock signal to generate a control signal; a current source generating a predetermined current; a current mirroring circuit unit connected to a first operating voltage terminal, and having a plurality of upper side current mirroring units respectively mirroring the current from the current source to create a current having a predetermined amplitude; a first current adjusting unit individually selecting a portion of the plurality of upper side current mirroring units according to the control signal; and a path switching circuit unit switched according to the path switching signal so as to select a charging path between the first current adjusting unit and a power switch or a discharging path between the power switch and the ground.

The PWM control unit may vary the pulse width of the clock signal depending on the load so as to provide a first path switching signal, and provide a second path switching signal having an opposite phase to the first path switching signal.

The clock counter may count the pulses of the clock signal so as to generate the control signal having a predetermined number of bits.

According to another aspect of the present invention, there is provided a switched-mode power supply including: a PWM control unit generating a predetermined clock signal and varying pulse widths of the clock signal depending on a load so as to provide path switching signals, the path switching signals including first and second switch signals having opposite phases; a clock counter counting the clock signal so as to generate a control signal having a predetermined number of bits; a current source generating a predetermined current; a current mirroring circuit unit connected to a first operating voltage terminal, and having a plurality of upper side current mirroring units respectively mirroring the current from the current source to create a current having a predetermined amplitude; a first current adjusting unit individually selecting a portion of the plurality of upper side current mirroring units according to the control signal; and a path switching circuit unit switched according to the first and second path switching signals so as to select a charging path between the first current adjusting unit and a power switch or a discharging path between the power switch and the ground, wherein the first current adjusting unit periodically adjusts a current provided to the charging path according to the bits of the control signal.

The current source may include: a main PMOS transistor; a constant-voltage circuit unit; and a resistor circuit unit, wherein: the main PMOS transistor has its source connected to the predetermined first operating voltage terminal, its drain connected to the constant-voltage circuit unit, and its gate connected to the current mirroring circuit unit; the constant-voltage circuit unit is connected between the drain of the main PMOS transistor and the resistor circuit unit so as to generate a constant predetermined voltage; and the resistor circuit unit has at least one resistor element connected between the constant-voltage circuit unit and the ground.

The plurality of upper side current mirroring units of the current mirroring circuit unit may include first to $n^{th}$ PMOS transistors respectively mirroring the current in the main PMOS transistor to create a current having a predetermined amplitude.

The first current adjusting unit may include switches each selecting the respective predetermined portion upper side current mirroring units from among the plurality of upper side current mirroring units according to the control signal.

The first current adjusting unit may include first to $k^{th}$ switches each selecting the respective predetermined third to $n^{th}$ upper side current mirroring units from among the plurality of first to $n^{th}$ upper side current mirroring units according to the control signal, wherein k is two or more.

The path switching circuit unit may include: a charging switch connected between the first current adjusting unit and the power switch so as to switch the charging path on or off according to the path switching signal; and a discharging switch connected between the power switch and the ground so as to switch the discharging path on or off according to the path switching signal.

According to another aspect of the present invention, there is provided a switched-mode power supply including: a PWM control unit generating a predetermined clock signal and varying pulse widths of the clock signal depending on a load to provide a path switching signal; a clock counter counting the clock signal to generate a control signal; a current source generating a predetermined current; a current mirroring circuit unit connected to a first operating voltage terminal, and having a plurality of upper side current mirroring units respectively mirroring the current from the current source to create a current having a predetermined amplitude; a first current adjusting unit individually selecting a portion of the plurality of upper side current mirroring units according to the control signal; a path switching circuit unit switched according to the path switching signal so as to select a charging path between the first current adjusting unit and a power switch or a discharging path connected to the power switch; a second current adjusting unit individually selecting a portion of a plurality of current paths connected to the discharging path in parallel according to the control signal; and a current generating unit connected between the second current adjusting unit and the ground, and having a plurality of lower side current mirroring units respectively mirroring the current in the current mirroring circuit unit to create an equal current.

The PWM control unit may vary the pulse width of the clock signal depending on the load so as to provide a first path switching signal, and provide a second path switching signal having an opposite phase to the first path switching signal.

The clock counter may count the pulses of the clock signal so as to generate the control signal having a predetermined number of bits.

According to another aspect of the present invention, there is provided a switched-mode power supply including: a PWM control unit generating a predetermined clock signal and varying pulse widths of the clock signal depending on a load to provide path switching signals, the path switching signals including first and second switch signals having opposite phases; a clock counter counting the clock signal to generate a control signal having a predetermined number of bits; a current source generating a predetermined current; a current mirroring circuit unit connected to a first operating voltage terminal, and having a plurality of upper side current mirroring units respectively mirroring the current from the current source to create a current having a predetermined amplitude; a first current adjusting unit individually selecting a portion of the plurality of upper side current mirroring units according to the control signal; a path switching circuit unit switched according to the path switching signal so as to select a charging path between the first current adjusting unit and a power switch or a discharging path connected to the power switch; a second current adjusting unit individually selecting a portion of a plurality of current paths connected to the discharging path in parallel according to the control signal; and a current generating unit connected between the second current adjusting unit and the ground, and having a plurality of lower side current mirroring units respectively mirroring the current in the current mirroring circuit unit to create an equal current, wherein the first current adjusting unit periodically adjusts a current provided to the charging path according to the bits of the control signal, and the second current adjusting unit operates in synchronization with the first current adjusting unit according to the bits of the control signal, and periodically adjusts a current provided to the discharging path.

The current source may include: a main PMOS transistor; a constant-voltage circuit unit; and a resistor circuit unit, wherein: the main PMOS transistor has its source connected to the predetermined first operating voltage terminal, its drain connected to the constant-voltage circuit unit, and its gate connected to the current mirroring circuit unit; the constant-voltage circuit unit is connected between the drain of the main PMOS transistor and the resistor circuit unit so as to generate a constant predetermined voltage; and the resistor circuit unit has at least one resistor element connected between the constant-voltage circuit unit and the ground.

The plurality of upper side current mirroring units of the current mirroring circuit unit may include first to $n^{th}$ PMOS transistors respectively mirroring the current in the main PMOS transistor to create a current having a predetermined amplitude.

The first current adjusting unit may include switches each selecting the respective predetermined portion upper side current mirroring units from among the plurality of upper side current mirroring units according to the control signal.

The first current adjusting unit may include first to $k^{th}$ switches each selecting the respective predetermined third to $n^{th}$ upper side current mirroring units from among the plurality of first to $n^{th}$ upper side current mirroring units according to the control signal, wherein k is two or more.

The path switching circuit unit may include: a charging switch connected between the first current adjusting unit and the power switch so as to switch the charging path on or off according to the path switching signal; and a discharging switch connected between the power switch and the second current adjusting unit so as to switch the discharging path on or off according to the path switching signal.

The second current adjusting unit may include switches each selecting the respective predetermined portion lower side current mirroring units from among the plurality of lower side current mirroring units according to the control signal.

The second current adjusting unit may include first to $k^{th}$ switches each selecting the respective predetermined third to $n^{th}$ lower side current mirroring units from among the plurality of first to $n^{th}$ lower side current mirroring units according to the control signal, wherein k is two or more.

The current generating unit may include: a first NMOS transistor connected between a first PMOS transistor included in the current mirroring circuit unit and the ground; a second NMOS transistor connected between the path switching circuit unit and the ground so as to mirror the current in the first NMOS transistor; and third to $n^{th}$ NMOS transistors each connected between the respective first to $k^{th}$ switches of the second current adjusting unit and the ground, so as to mirror the current in the first NMOS transistor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
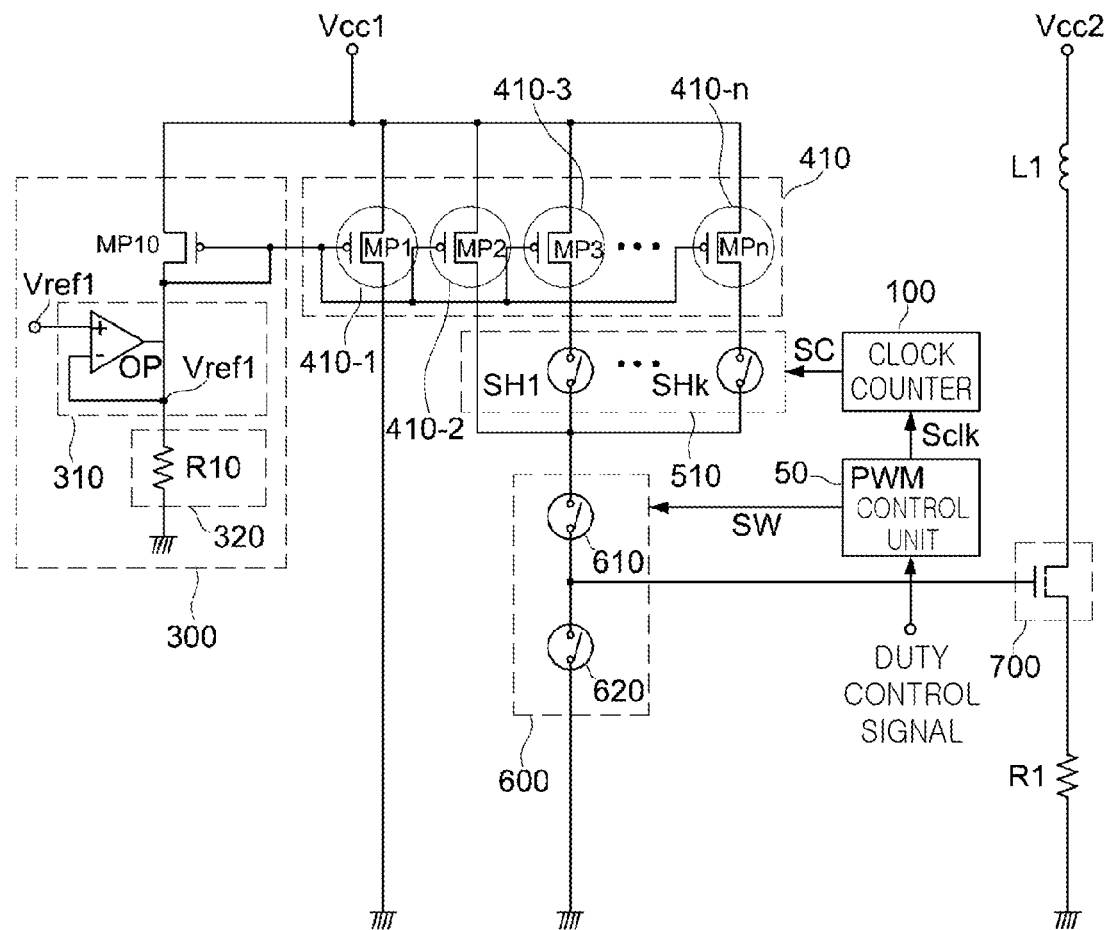
FIG. 1 is a circuit diagram of a switched-mode power supply according to an embodiment of the present invention.

Hereinafter, embodiments of the present invention will be described in detail. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Throughout the drawings, the same or like reference numerals will be used to designate the same or like elements.

FIG. 1 is a circuit diagram of a switched-mode power supply according to an embodiment of the present invention.

Referring to FIG. 1, the switched-mode power supply may include a PWM control unit 50, a clock counter 100, a current source 300, a current mirroring circuit unit 410, a first current adjusting unit 510, and a path switching circuit unit 600.

Referring to FIG. 1, the PWM control unit 50 may generate a predetermined clock signal Sclk, and may vary the pulse width of the clock signal Sclk depending on a load so as to provide a path switching signal SW.

As an exemplary implementation, the PWM control unit 50 may receive a duty control signal depending on the load condition, and may vary the pulse width of the clock signal Sclk to generate the path switching signal SW. Here, the clock signal Sclk may be predetermined in view of a switching frequency. The path switching signal SW is provided to select a charging path or a discharging path.

The clock counter 100 may count the clock signal Sclk to generate a control signal SC. Here, the control signal SC may include bit number corresponding to the number of switches included in the first current adjusting unit 510.

The current source 300 may generate a current Vref1/R10 determined depending on a predetermined reference voltage Vref1 and a resistance R10.

As an exemplary implementation, the current source 300 may include a main PMOS transistor MP10, a reference voltage circuit unit 310 and a resistor circuit unit 320.

The main PMOS transistor MP10 may have its source connected to a predetermined first operating voltage (Vcc1) terminal, its drain connected to the reference voltage circuit unit 310, and its gate connected to the current mirroring circuit unit 410.

The reference voltage circuit unit 310 may include a operation amplifier OP having a non-inverted input terminal to receive the reference voltage Vref1, an inverted input terminal connected to the drain of the main PMOS transistor MP10, and an output terminal. Here, the inverted input terminal and the output terminal of the operational amplifier OP are connected to each other, so that the output voltage of the operational amplifier OP becomes equal to the reference voltage Vref1 due to the nature of the operational amplifier OP.

The resistor circuit unit 320 may include at least one resistor R10 connected between the reference voltage circuit unit 310 and the ground.

Accordingly, the current Vref1/R10 flowing through the main PMOS transistor MP10 may be determined depending on the first reference voltage Vref1 and the resistance R10.

The current mirroring circuit unit 410 may be connected to the first operating voltage Vcc1 terminal, and may mirror a current from the current source 300 to create currents having a predetermined amplitude so as to provide currents having the predetermined amplitude to a plurality of current paths.

For example, the current mirroring circuit unit 410 may include first to $n^{th}$ upper side current mirroring units 410-1 to 410-n, and each of the first to $n^{th}$ upper side current mirroring units 410-1 to 410-n may mirror the current in the main PMO transistor MP10 to create a current having a predetermined amplitude.

As an exemplary implementation, each of the first to $n^{th}$ upper side current mirroring units 410-1 to 410-n may include respective first to $n^{th}$ PMOS transistors MP1 to MPn. Here, each of the first to $n^{th}$ PMOS transistors MP1 to MPn may provide the current from the main PMOS transistor MP10 as a current having a predetermined amplitude.

Here, the current mirroring circuit unit 410 may mirror a current larger than the current Is from the current source 300.

For example, the current mirroring ratio between the current source 300 and the current mirroring circuit unit 410 may be 1:100. In this case, assuming that the current Is is several μA, a current mirrored by the current mirroring circuit unit 410 may be several hundreds of mA. It will be obvious to those skilled in the art that the current mirroring ratios may be set between transistors.

Such a current mirroring ratio is merely illustrative, and may vary under different system environments to which the present invention is applied.

The first current adjusting unit 510 may individually select a portion of the first to $n^{th}$ upper side current mirroring units 410-1 to 410-n according to the control signal SC.

For example, the first current adjusting unit 510 may include a plurality of switches. Each of the plurality of switches may select each of predetermined portion upper side current mirroring units from among the first to $n^{th}$ upper side current mirroring units 410-1 to 410-n according to the control signal SC.

As an exemplary implementation, the first current adjusting unit 510 may include first to $k^{th}$ switches SH1 to SHk, where k is 2 or more. Here, each of the first to $k^{th}$ switches SH1 to SHk may select the respective predetermined third to the $n^{th}$ upper side current mirrors 410-3 to 410-n from among the first to $n^{th}$ upper side current mirror units 410-1 to 410-n according to the control signal SC.

That is, the first switch SH1 may select the third upper side current mirroring unit 410-3, the second switch SH2 may select the fourth upper side current mirroring unit 410-4, the third switch SH3 may select the fifth upper side current mirroring unit 410-5, and the $k^{th}$ switch SHk may select the $n^{th}$ upper side current mirroring unit 410-n.

Accordingly, each of the first to $n^{th}$ upper side current mirroring units 410-1 to 410-n may provide mirrored current, such that the current may be adjusted by the number selected by the first current adjusting unit 510. Depending on the operation of the first current adjusting unit 510, the voltage gradient charged through the charging path of the power switch 700 may be determined.

As a result, since the charging gradient is determined depending on the current adjusted by the first current adjusting unit 510, the rising gradient of a pulse of the switch operating voltage provided to a power switch may be varied by varying a current in the first current adjusting unit 510.

The path switching circuit unit 600 may be connected between the first current adjusting unit 510 and the power switch 700, and may be switched according to the path switching signal SW, to select the charging path between the first current adjusting unit 510 and the power switch 700 or the discharging path between the power switch 700 and the ground.

As an exemplary implementation, the path switching circuit unit 600 may include a charging switch 610 and a discharging switch 620.

The charging switch 610 may be connected between the first current adjusting unit 510 and the power switch 700, and may switch the charging path on or offs according to the path switching signal SW. The discharging switch 620 may be connected between the power switch 700 and the ground, and may switch the discharging path on or offs according to the path switching signal SW.

As an example, when the charging switch 610 is switched on and the discharging switch 620 is switched off according to the path switching signal SW, the charging path between the first current adjusting unit 510 and the power switch 700 may be connected while the discharging path between the power switch 700 and the ground may be disconnected. Alternatively, when the charging switch 610 is switched off and the discharging switch 620 is switched on according to the path switching signal SW, the charging path between the first current adjusting unit 510 and the power switch 700 is disconnected while the discharging path between the power switch 700 and the ground may be connected.

The power switch 700 may be operated by the switch operating voltage pulse provided by the path switching circuit unit 600. A primary coil L1 may be connected between the power switch 700 and a second operating voltage Vcc2 terminal. Further, between the power switch 700 and the ground, a first resistor R1 may be connected.

Here, the power switch 700 may be switched according to pulses of the switching operation voltage, and, accordingly, energy may be induced from the primary coil to a secondary coil not shown.

Figure 2:
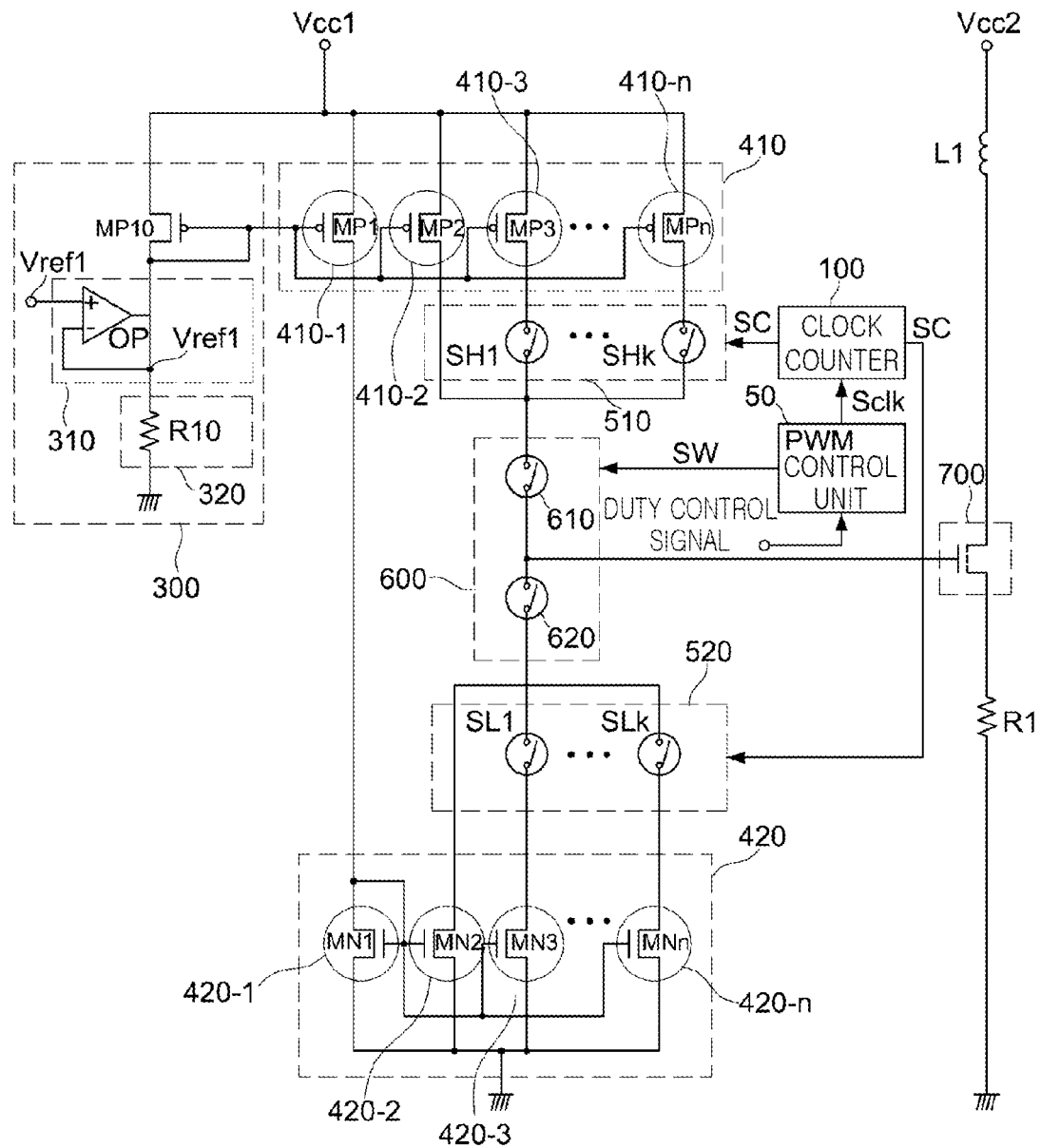
FIG. 2 is a circuit diagram of a switched-mode power supply according to another embodiment of the present invention.

FIG. 2 is a circuit diagram of a switched-mode power supply according to another embodiment of the present invention.

Referring to FIG. 2, the switched-mode power supply may include a PWM control unit 50, a clock counter 100, a current source 300, a current mirroring circuit unit 410, a first current adjusting unit 510, a second current adjusting unit 520, a current generating unit 420, and a path switching circuit unit 600.

Of the operations of the PWM control unit 50, the clock counter 100, the current source 300, the current mirroring circuit unit 410 and the first current adjusting unit 510 shown in FIG. 2, descriptions on the same operations with those in FIG. 1 may be omitted.

The path switching circuit unit 600 may be switched according to the path switching signal SW, to select the charging path between the first current adjusting unit 510 and the power switch 700 or the discharging path between the power switch 700 and the current generating unit 420.

The second current adjusting unit 520 may operate in synchronization with the first current adjusting unit 510 according to the control signal SC, and may individually select a portion of a plurality of current paths connected to the discharging path in parallel.

The current generating unit 420 may be connected between the second current adjusting unit 520 and the ground, and may include first to $n^{th}$ lower side current mirroring units 420-1 to 420n. Each of the first to $n^{th}$ lower side current mirroring units 420-1 to 420n may mirror the same current with the current mirroring circuit unit 410.

As an exemplary implementation, each of the first to $n^{th}$ lower side current mirroring units 420-1 to 420-n may include respective first to $n^{th}$ NMOS transistors MN1 to MNn.

At first, the first NMOS transistor MN1 may be connected between the first PMOS transistor MP1 included in the current mirroring circuit unit 410 and the ground. That is, the first NMOS transistor MN1 may have its drain and gate connected to the drain of the first PMOS transistor MP1, and its source connected to the ground. At this time, the current flowing through the first NMOS transistor MN31 is equal to the current flowing through the first PMOS transistor MP31.

Then, the second NMOS transistor MN2 may be connected between the path switching circuit unit 600 and the ground. That is, the second NMOS transistor MN2 may have its drain connected to the path switching circuit unit 600, its gate connected to the gate of the first NMOS transistor MN1, and its source connected to the ground. At this time, the second NMOS transistor MN2 may mirror the current in the first NMOS transistor MN1.

In addition, each of the third to $n^{th}$ NMOS transistors MN3 to MNn is connected between the respective first to $k^{th}$ switches SH1 to SHk of the second current adjusting unit 520 and the ground. Each of the third to $n^{th}$ NMOS transistors MN3 to MNn has its drain connected to the respective first to $k^{th}$ switches SH1 to SHk of the second current adjusting unit 520, its gate connected to the gate of the first NMOS transistor MN1, and its source connected to the ground. Accordingly, each of the third to $n^{th}$ NMOS transistors MN3 to MNn may mirror the current in the first NMOS transistor upon selected by each of the first to $k^{th}$ switches SH1 to SHk of the second current adjusting unit 520.

Regarding the current generating unit 420, the second current adjusting unit 520 may include a plurality of switches, and each of the plurality of switches may select the respective predetermined portion of the lower side current mirrors from among the plurality of the lower side current mirroring units according to the control signal SC.

As an exemplary implementation, the second current adjusting unit 520 may include first to $k^{th}$ switches SL1 to SLk, where k is 2 or more, and each of the first to $k^{th}$ switches SL1 to SLk may select predetermined third to $n^{th}$ lower side mirror units 420-3 to 420-n from among the plurality of first to n' lower side current mirroring units 420-1 to 420-n according to the control signal SC.

Accordingly, each of the first to $n^{th}$ lower side current mirroring units 420-1 to 420-n may provide mirrored current, such that the current may be adjusted by the number selected by the second current adjusting unit 520. Depending on the operation of the second current adjusting unit 520, the voltage gradient discharged through the discharging path of the power switch 700 may be determined.

As a result, since the discharging gradient is determined depending on the current adjusted by the second current adjusting unit 520, the falling gradient of a pulse of the switch operating voltage provided to a power switch may be varied by varying a current in the second current adjusting unit 520.

Figure 3:
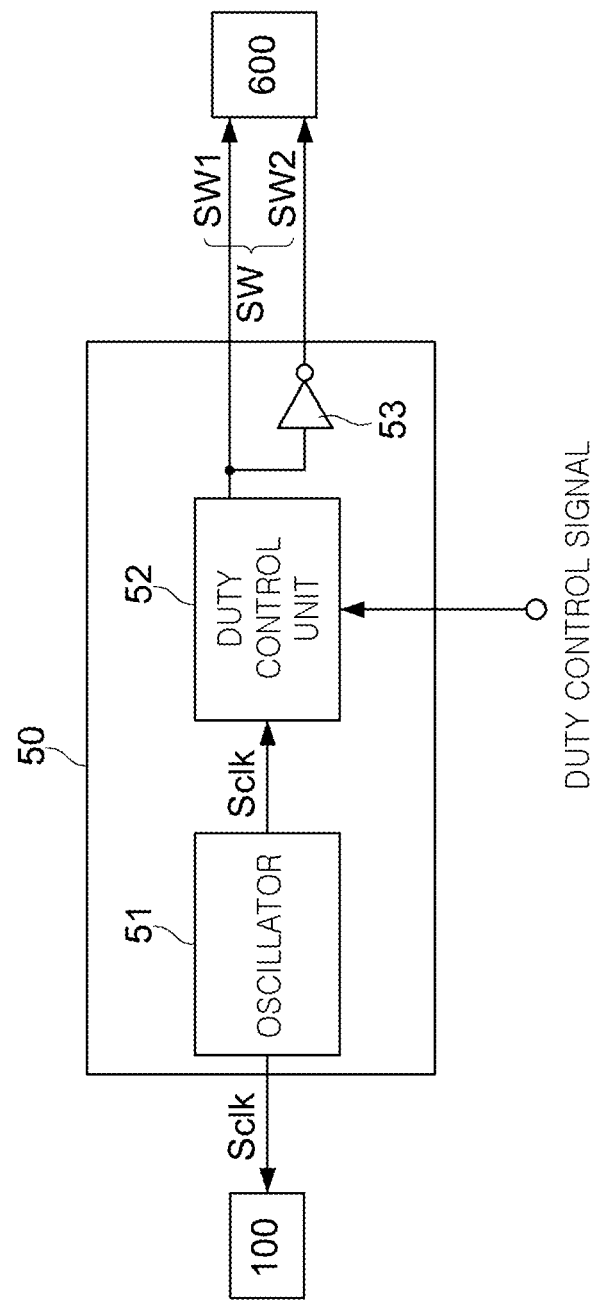
FIG. 3 is a block diagram illustrating the configuration of a PWM control unit according to an embodiment of the present invention.

FIG. 3 is a block diagram illustrating the configuration of a PWM control unit according to an embodiment of the present invention.

Referring to FIG. 3, as an exemplary implementation, The PWM control unit 50 may include an oscillator 51, a duty control unit 52, and an inverter 53.

The oscillator 51 may generate the clock signal Sclk including a pulse train having a predetermined period.

The duty control unit 52 may receive the duty control signal, and may vary the pulse width of the clock signal Sclk to generate a first path switching signal SW1.

Then, the inverter 53 may invert the phase of the first path switching signal SW1, to provide a second path switching signal SW2 having an opposite phase with the first path switching signal SW1.

Figure 4:
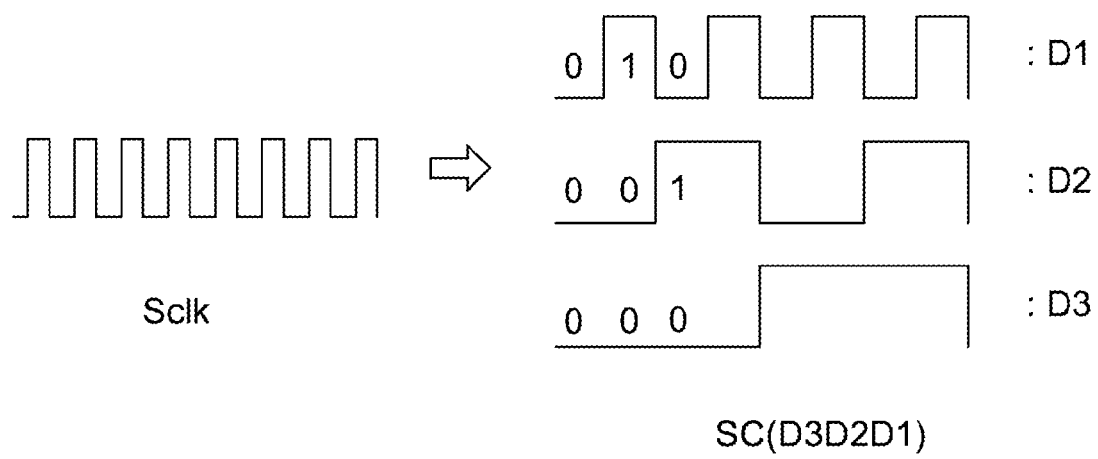
FIG. 4 is a diagram illustrating the operation of a clock counter according to an embodiment of the present invention.

FIG. 4 is a diagram illustrating the operation of a clock counter according to an embodiment of the present invention.

Referring to FIG. 1 to FIG. 4, the clock counter 100 may count pluses of the clock signal Sclk, to generate the control signal SC having a predetermined plurality of bits D1 to Dk.

For example, when the control signal SC includes three bits, i.e., first to third bits D3, D2 and D1, the clock counter 100 may count up for every pulse of the clock signal Sclk, and may change the bits of the control signal SC 'D3D2D1' into '000,' '001,' '010' and the like.

Figure 5:
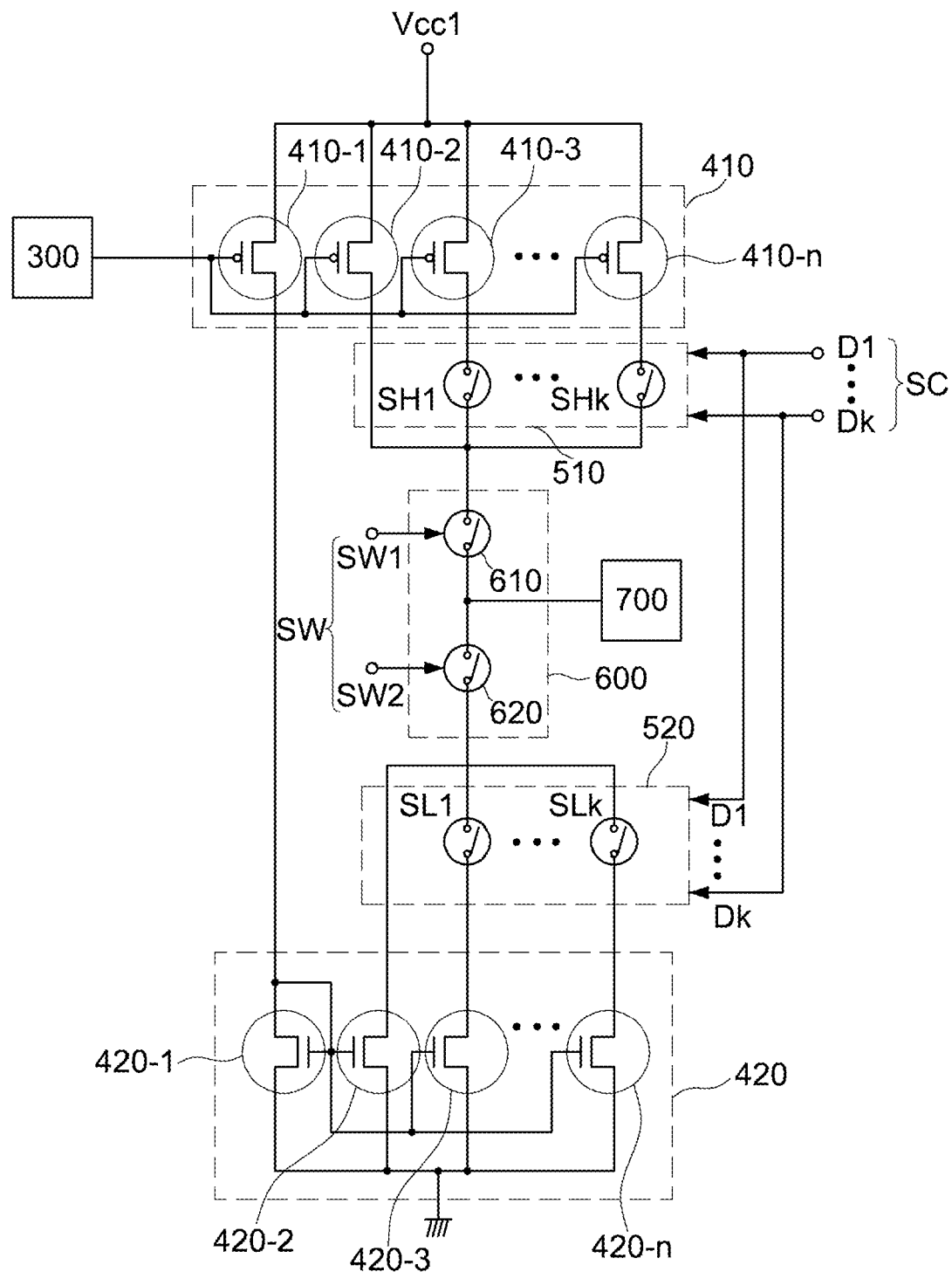
FIG. 5 is a diagram illustrating a portion of the switched-mode power supply of FIG. 2 in more detail.

FIG. 5 is a diagram illustrating a portion of the switched-mode power supply of FIG. 2 in more detail.

Referring to FIGS. 1 to 5, the first to $k^{th}$ switches SH1 to SHk included in the first current adjusting unit 510 may be switched by the control signal SC having the plurality of bits D1 to Dk.

For example, the first switch SH1 may be operated by the first bit D1 of the control signal SC, the second switch SH2 may be operated by the second bit D2 of the control signal SC, and the $k^{th}$ switch SHk may be operated by the $k^{th}$ bit Dk of the control signal SC.

The current provided to the power switch 700 via the charging path is varied according to such operations of the first current adjusting unit 510, such that the gradient of the charging voltage may be varied.

In addition, the first to $k^{th}$ switches SL1 to SLk included in the second current adjusting unit 520 may be switched by the control signal SC having the plurality of bits D1 to Dk.

For example, the first switch SL1 may be operated by the first bit D1 of the control signal SC, the second switch SL2 may be operated by the second bit D2 of the control signal SC, and the $k^{th}$ switch SLk may be operated by the $k^{th}$ bit Dk of the control signal SC.

The current flowing from the power switch to the ground via the discharging path is varied according to such operations of the second current adjusting unit 520, such that the gradient of the discharging voltage may be varied.

Figure 6:
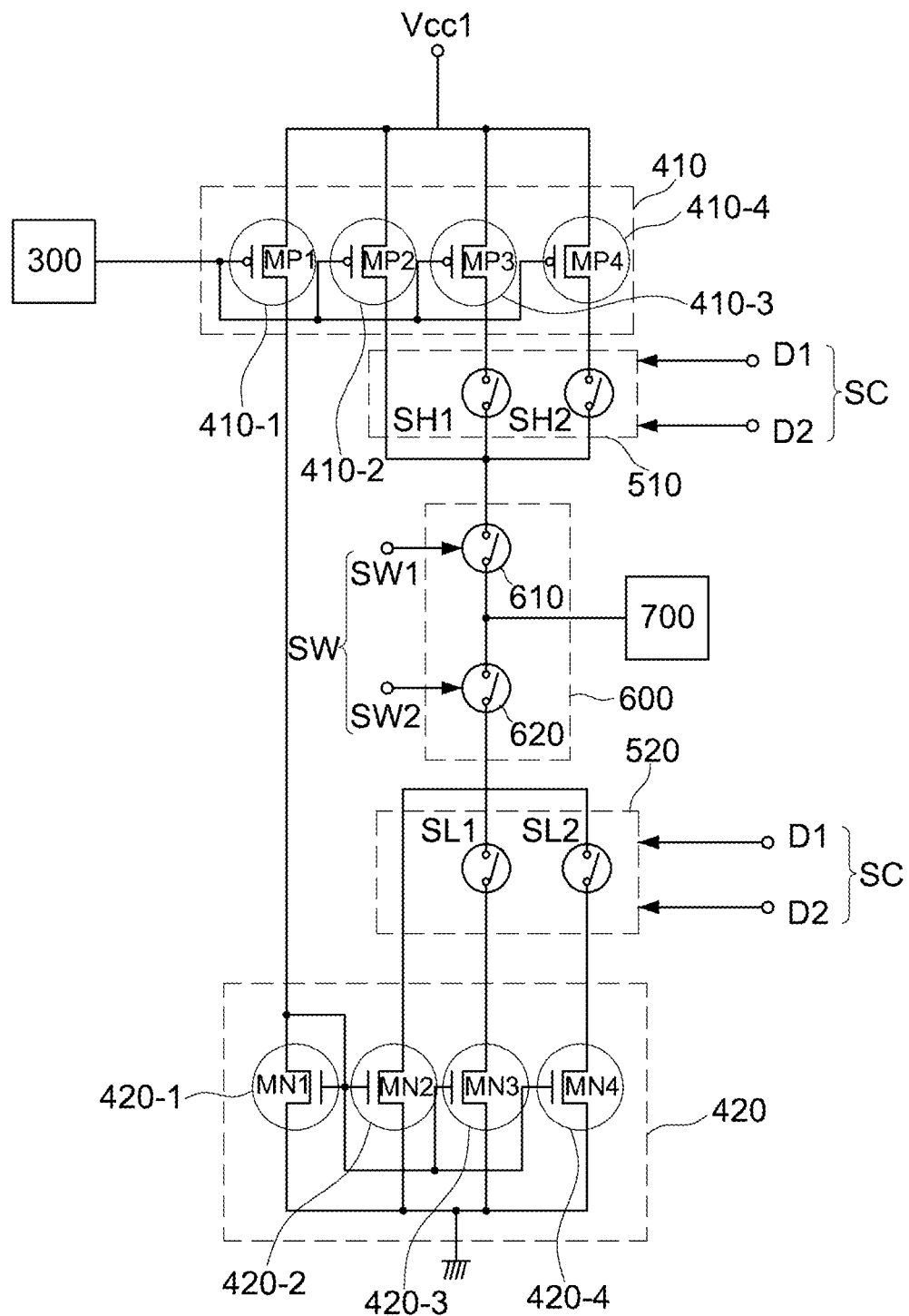
FIG. 6 is a diagram illustrating the operation of a switched-mode power supply according to an embodiment of the present invention.
Figure 7:
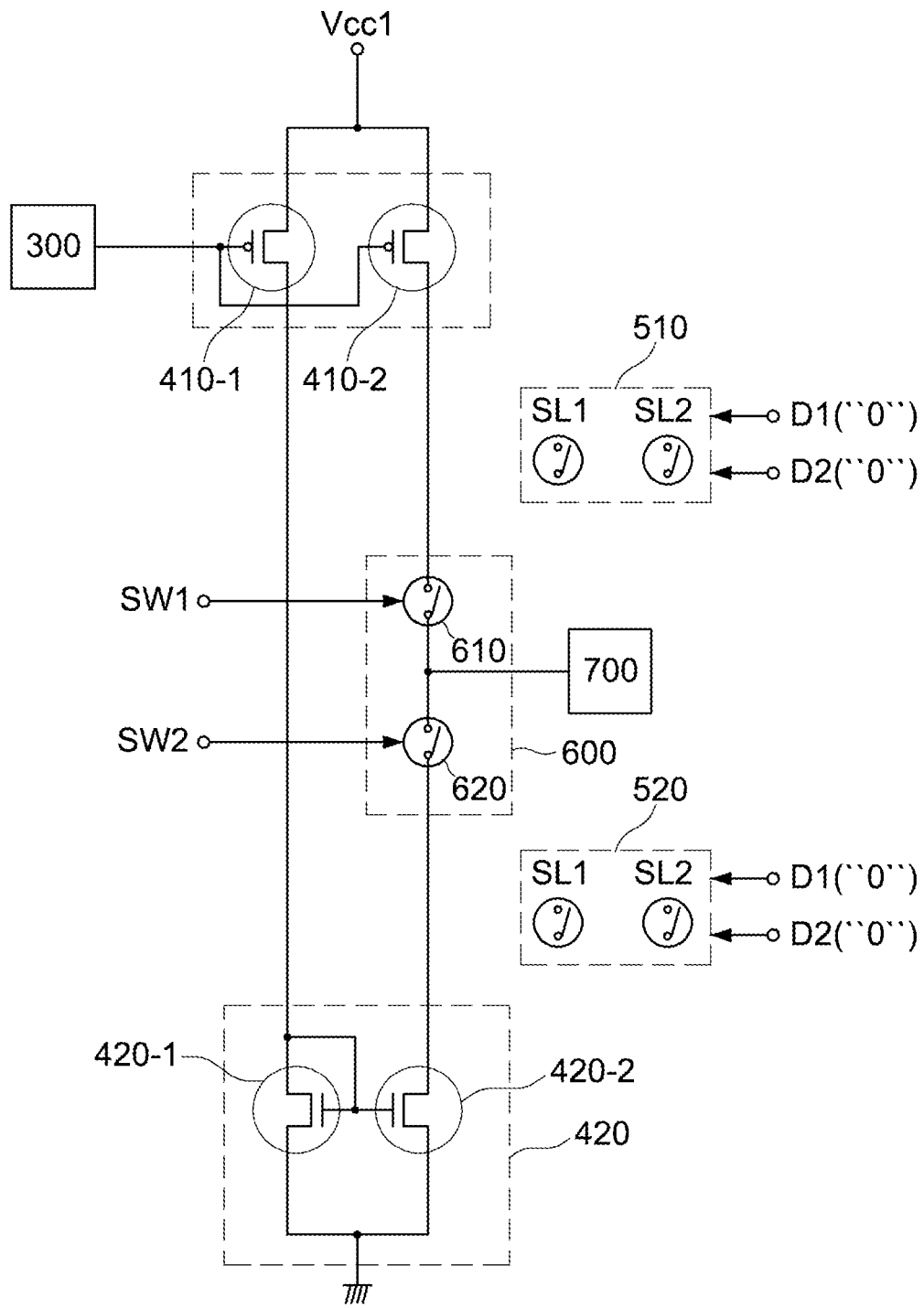
FIG. 7 is a diagram illustrating a first operation of the switched-mode power supply according to the embodiment of the present invention.
Figure 8:
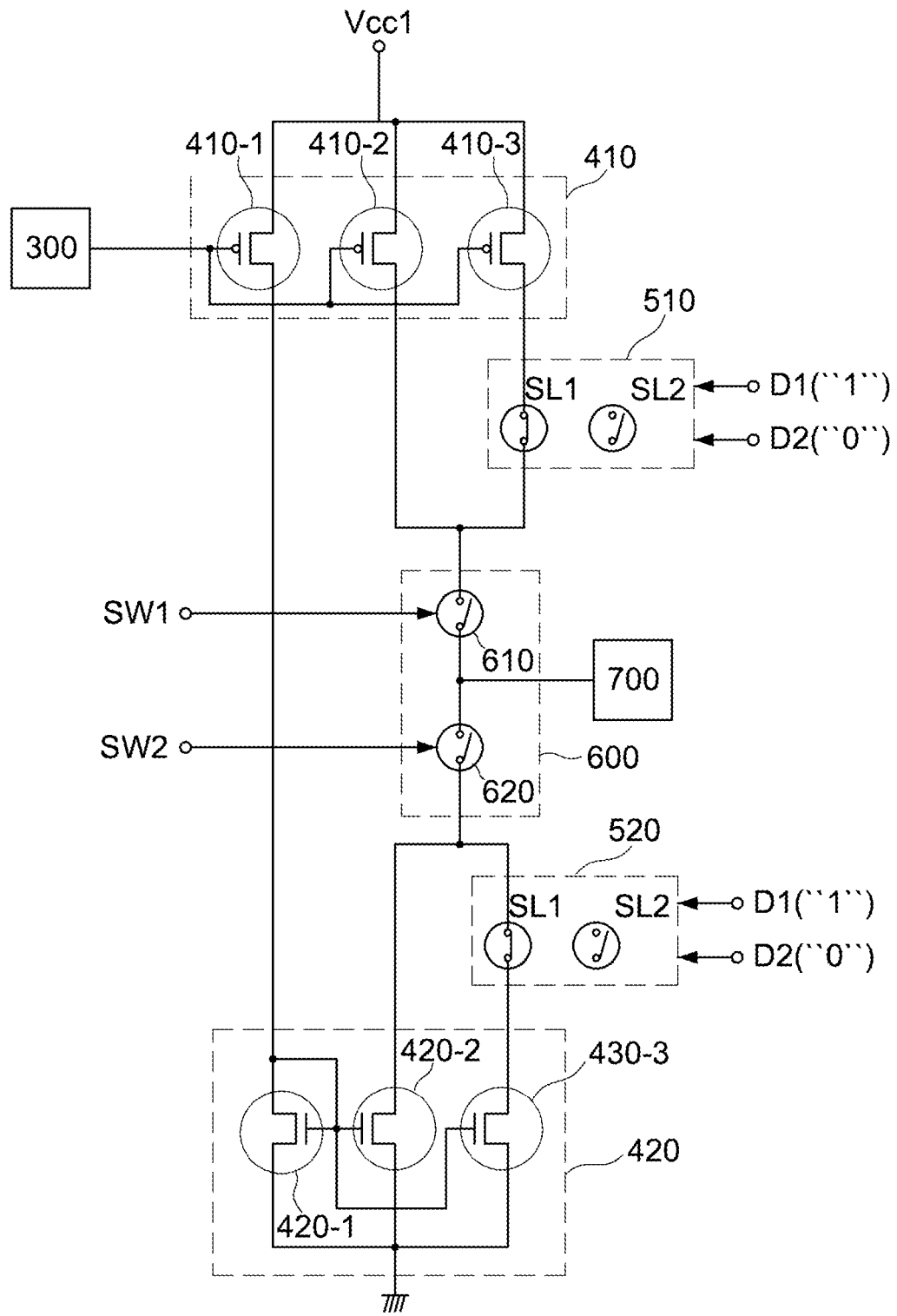
FIG. 8 is a diagram illustrating a second operation of the switched-mode power supply according to the embodiment of the present invention.
Figure 9:
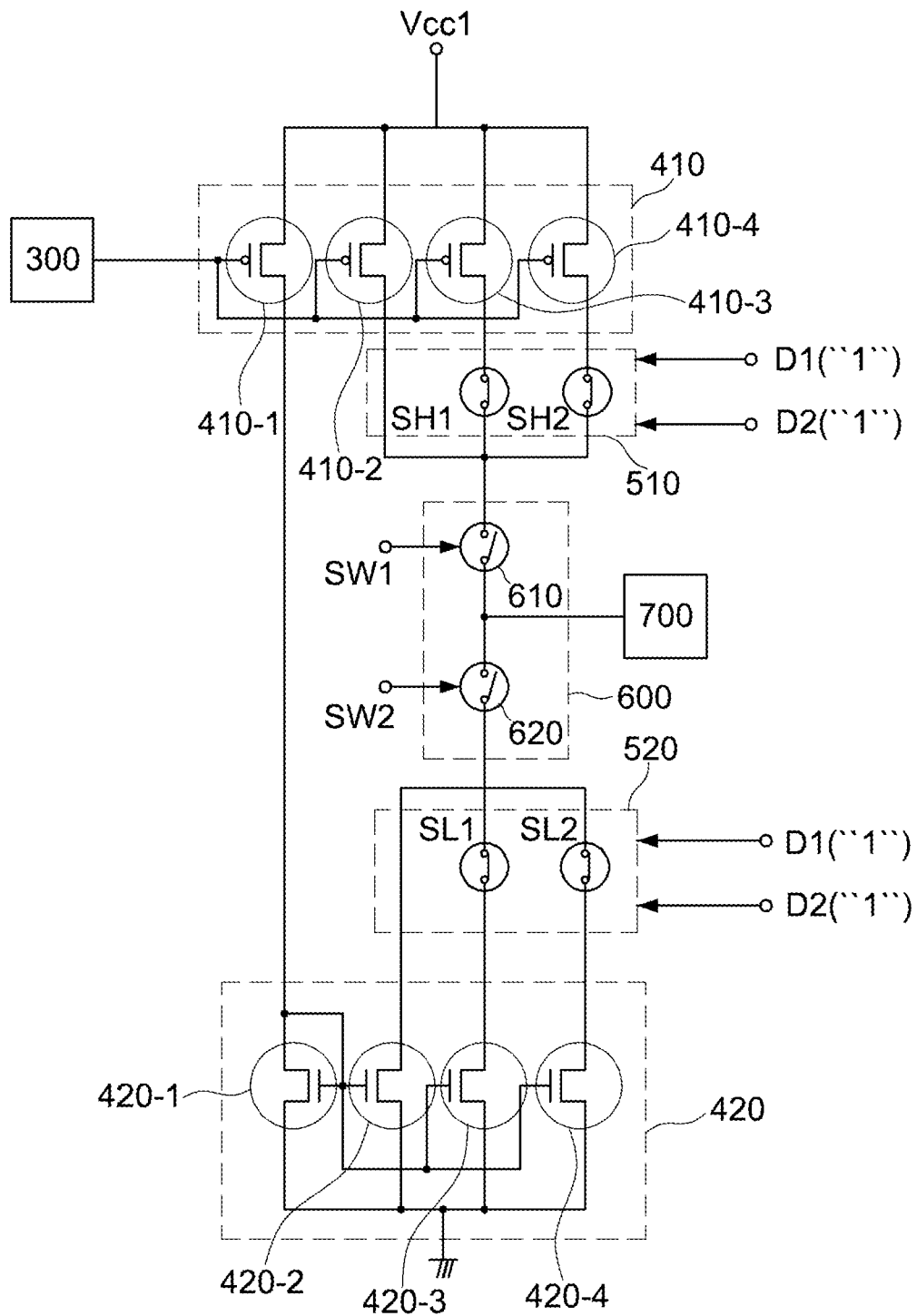
FIG. 9 is a diagram illustrating a third operation of the switched-mode power supply according to the embodiment of the present invention.

FIG. 6 is a diagram illustrating the operation of a switched-mode power supply according to an embodiment of the present invention, FIG. 7 is a diagram illustrating a first operation of the switched-mode power supply according to the embodiment of the present invention, and FIG. 8 is a diagram illustrating a second operation of the switched-mode power supply according to the embodiment of the present invention. FIG. 9 is a diagram illustrating a third operation of the switched-mode power supply according to the embodiment of the present invention.

Referring to FIGS. 1 to 6, the current mirroring circuit unit 210 may include first to fourth upper side current mirroring units 410-1 to 410-4. Each of the first to fourth upper side current mirroring units 410-1 to 410-4 may include respective first to 4th PMOS transistors MP1 to MP4.

Here, the first current adjusting unit 510 may include first and second switches SH1 and SH2 each selecting the respective predetermined the third and fourth upper side current mirroring units 410-3 and 410-4 from among the first to fourth upper side current mirroring units 410-1 to 410-4 according to the bits D1 and D2 of the control signal SC.

Further, the current generating unit 420 may include first to fourth lower side current mirroring units 420-1 to 420-4. Each of the first to fourth lower side current mirroring units 420-1 to 420-4 may include respective first to 4th NMOS transistors MN1 to MN4.

Here, the second current adjusting unit 520 may include first and second switches SL1 and SL2 each selecting the respective predetermined the third and fourth lower side current mirroring units 420-3 and 420-4 from among the first to fourth lower side current mirroring units 420-1 to 410-4 according to the bits D1 and D2 of the control signal SC.

The operation under such configurations will be described with reference to FIGS. 7 to 9.

Referring to FIG. 7, when the first and second bits D1 and D2 of the control signal SC are "0" and "0," respectively, the first and second switches SH1 and SH2 of the first current adjusting unit 510 are switched off so that the third and fourth upper side current mirroring units 410-3 and 410-4 are not connected to the circuit. At the same time, the first and second switches SL1 and SL2 of the second current adjusting unit 520 are switched off, so that the third and fourth lower side current mirroring units 420-3 and 420-4 are not connected, either.

At this time, the mirroring current flows from the current source 300 via the first upper side current mirroring unit 410-1 and the first lower side current mirroring unit 420-1.

During the charging operation, when the charging switch 610 of the path switching circuit unit 600 is switched on and the discharging switch 620 thereof is switched off according to the first and second path switching signals SW1 and SW2, the current flowing through the second upper side current mirroring unit 410-2 is provided to the power switch 700, and voltage is charged in the power switch 700.

During the discharging operation, when the charging switch 610 of the path switching circuit unit 600 is switched off and the discharging switch 620 thereof is switched on according to the first and second path switching signals SW1 and SW2, the current flows from the power switch 700 to the ground through the second lower side current mirroring unit 420-2, and voltage is discharged from the power switch 700 to the ground.

In FIG. 7, the gradient of the charging voltage is determined by the current flowing through the second upper side current mirroring unit 410-2, and the gradient of the discharging voltage is determined by the current flowing through the second lower side current mirroring unit 420-2.

Referring to FIG. 8, when the first and second bits D1 and D2 of the control signal SC are "1" and "0," respectively, the first switch SH1 of the first current adjusting unit 510 is switched on and the second switch SH2 thereof is switched off, so that the third upper side current mirroring unit 410-3 is connected to the circuit whereas the fourth upper side current mirroring unit 410-4 is not connected to the circuit. At the same time, the first switch SL1 of the second current adjusting unit 520 is also switched on and the second switch SL2 thereof is switched off, so that the third lower side current mirroring unit 420-3 is connected to the circuit and the fourth lower side current mirroring unit 420-4 is not connected to the circuit.

Likewise, the mirroring current flows from the current source 300 via the first upper side current mirroring unit 410-1 and the first lower side current mirroring unit 420-1.

During the charging operation, when the charging switch 610 of the path switching circuit unit 600 is switched on and the discharging switch 620 thereof is switched off according to the first and second path switching signals SW1 and SW2, the currents flowing through the second and third upper side current mirroring units 410-2 and 410-3 are provided to the power switch 700, and voltage is charged in the power switch 700.

During the discharging operation, when the charging switch 610 of the path switching circuit unit 600 is switched off and the discharging switch 620 thereof is switched on according to the first and second path switching signals SW1 and SW2, the currents flow from the power switch 700 to the ground through the second and third lower side current mirroring units 420-2 and 420-3, and voltage is discharged from the power switch 700 to the ground.

In FIG. 8, the gradient of the charging voltage is determined by the currents flowing through the second and third upper side current mirroring units 410-2 and 410-3, and the gradient of the discharging voltage is determined by the current flowing through the second and third lower side current mirroring units 420-2 and 420-3, such that the gradients are greater than those in the case of FIG. 7.

Referring to FIG. 9, when the first and second bits D1 and D2 of the control signal SC are "1" and "1," respectively, the first and second switches SH1 and SH2 of the first current adjusting unit 510 are switched on so that the third and fourth upper side current mirroring units 410-3 and 410-4 are connected to the circuit. At the same time, the first and second switches SL1 and SL2 of the second current adjusting unit 520 are switched on, so that the third and fourth lower side current mirroring units 420-3 and 420-4 are connected to the circuit.

Likewise, the mirroring current flows from the current source 300 via the first upper side current mirroring unit 410-1 and the first lower side current mirroring unit 420-1.

During the charging operation, when the charging switch 610 of the path switching circuit unit 600 is switched on and the discharging switch 620 thereof is switched off according to the first and second path switching signals SW1 and SW2, the currents flowing through the second, third and fourth upper side current mirroring units 410-2, 410-3 and 410-4 are provided to the power switch 700, and voltage is charged in the power switch 700.

During the discharging operation, when the charging switch 610 of the path switching circuit unit 600 is switched off and the discharging switch 620 thereof is switched on according to the first and second path switching signals SW1 and SW2, the currents flow from the power switch 700 to the ground through the second, third and fourth lower side current mirroring units 420-2, 420-3 and 420-4, and voltage is discharged from the power switch 700 to the ground.

In FIG. 9, the gradient of the chagrining voltage is determined by the currents flowing through the second, third and fourth upper side current mirroring units 410-2, 410-3 and 410-4 and the gradient of the discharging voltage is determined by the current flowing through the second, third and fourth lower side current mirroring units 420-2, 420-3 and 420-4, such that the gradients are greater than those in the case of FIG. 8.

Figure 10:
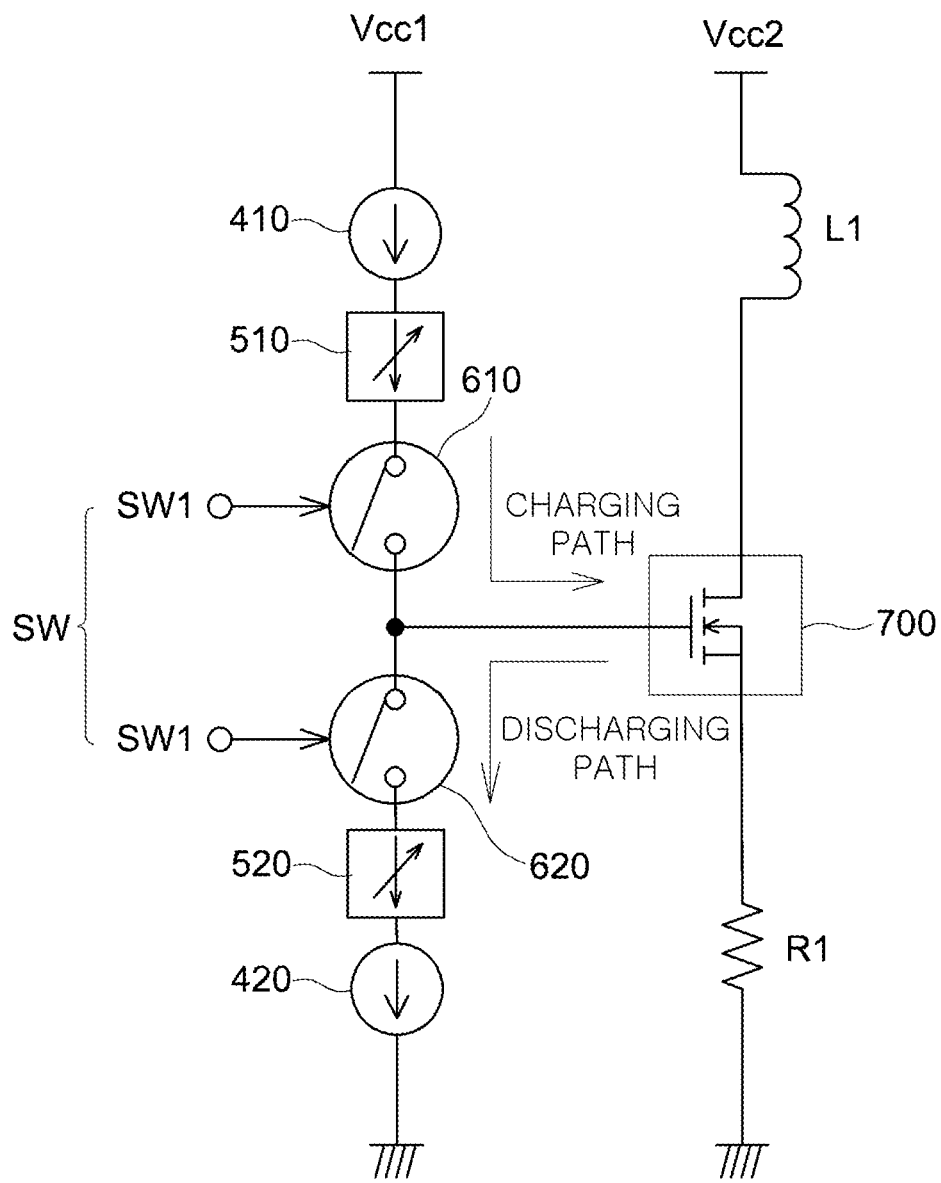
FIG. 10 is a diagram for illustrating the charging path and discharging path switched by a path switching circuit unit according to an embodiment of the invention.

FIG. 10 is a diagram for illustrating the charging path and discharging path switched by a path switching circuit unit according to an embodiment of the invention.

Referring to FIG. 10, when the charging switch 610 is switched on, voltage is charged in the power switch 700 by the currents from the current mirroring circuit unit 410 and the first current adjusting unit 510. When the discharging switch 620 is switched on, voltage is discharged from the power switch 700 to the ground by the currents from the second current adjusting unit 520 and the current generating unit 420.

The charging gradient of the power switch 700 is determined by the currents from the current mirroring circuit unit 410 and the first current adjusting unit 510, and the discharging gradient of the power switch 700 is determined by the currents from the second current adjusting unit 520 and the current generating unit 420. Moreover, the gradients of the charging and discharging voltages may be varied depending on the currents from the first and second current adjusting units 510 and 520.

Therefore, by adjusting the currents in the first and second current adjusting units 510 and 520, the gradients of the charging voltage and discharging voltage of the power switch 700 may be adjusted.

Figure 11:
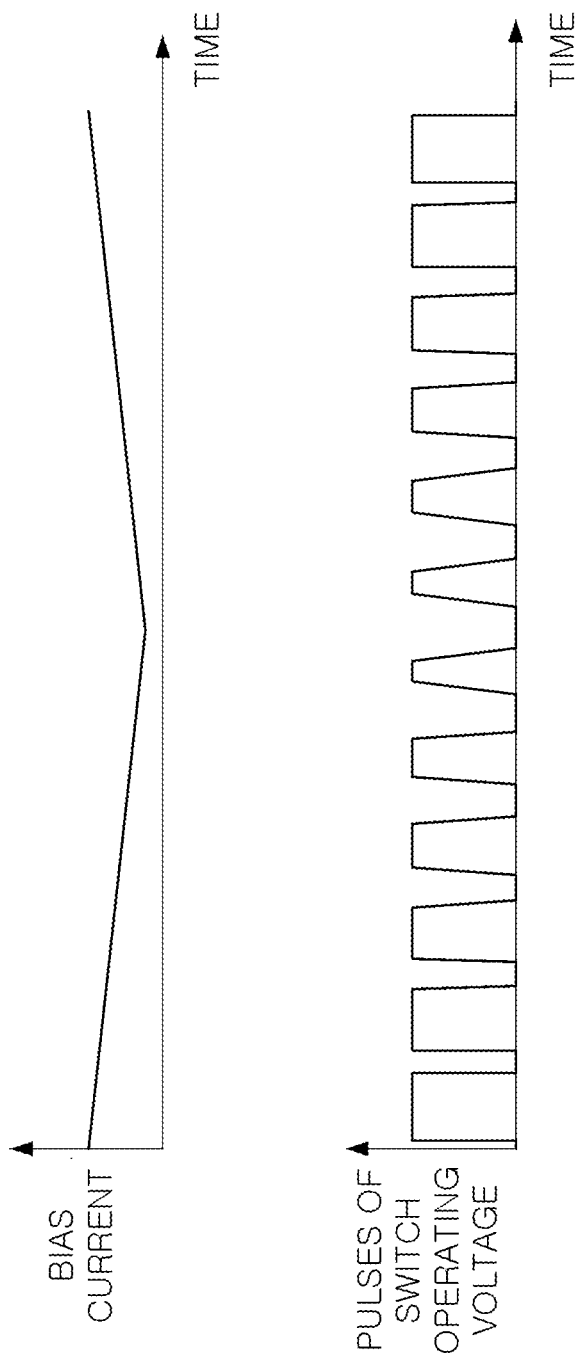
FIG. 11 is a pair of graphs each illustrating a bias current and pulses of a switch operating voltage, according to an embodiment of the invention.

FIG. 11 is a pair of graphs each illustrating a bias current and pulses of a switch operating voltage, according to an embodiment of the invention.

Referring to FIG. 11, by gradually adjusting the bias current provided to the power switch from the first and second current adjusting units 510 and 520, the rising gradient (charging gradient) and falling gradient (discharging gradient) of the pulses of the switch operating voltage supplied to the power switch 700 may be adjusted.

As described above, in the embodiments of the present invention, by adjusting the rising gradient (charging gradient) and falling gradient (discharging gradient) of the pulses of the switch operating voltage, for a given frequency of the pulses of the switch operating voltage, the timing of rising edges and falling edges of the pulses of the switch operating voltage are distributed, such that EMI characteristics can be improved.

As set forth above, according to embodiments of the present invention, switching noise can be reduced and thereby EMI characteristics can be improved by periodically varying a bias current so that the timings of rising edges and falling edges of pulses of a switch operating voltage are distributed.

While the present invention has been shown and described in connection with the embodiments, it will be apparent to those skilled in the art that modifications and variations can be made without departing from the spirit and scope of the invention as defined by the appended claims.

What is claimed is:

1. A switched-mode power supply comprising:
   a pulse width modulation (PWM) control unit generating a predetermined clock signal and varying pulse widths of the clock signal depending on a load to provide a path switching signal;
   a clock counter counting the clock signal to generate a control signal;
   a current source generating a predetermined current;
   a current mirroring circuit unit connected to a first operating voltage terminal, and having a plurality of upper side current mirroring units respectively mirroring the current from the current source to create a current having a predetermined amplitude;
   a first current adjusting unit individually selecting a portion of the plurality of upper side current mirroring units according to the control signal; and
   a path switching circuit unit switched according to the path switching signal so as to select a charging path between the first current adjusting unit and a power switch or a discharging path between the power switch and the ground.

2. The power supply of claim 1, wherein the PWM control unit varies the pulse width of the clock signal depending on the load so as to provide a first path switching signal, and provides a second path switching signal having an opposite phase to the first path switching signal.

3. The power supply of claim 1, wherein the clock counter counts the pulses of the clock signal so as to generate the control signal having a predetermined number of bits.

4. The power supply of claim 1, wherein the current source includes:
a main PMOS transistor;
a constant-voltage circuit unit; and
a resistor circuit unit, wherein:
the main PMOS transistor has its source connected to the predetermined first operating voltage terminal, its drain connected to the constant-voltage circuit unit, and its gate connected to the current mirroring circuit unit;
the constant-voltage circuit unit is connected between the drain of the main PMOS transistor and the resistor circuit unit so as to generate a constant predetermined voltage; and
the resistor circuit unit has at least one resistor element connected between the constant-voltage circuit unit and the ground.

5. The power supply of claim 4, wherein the plurality of upper side current mirroring units of the current mirroring circuit unit includes first to $n^{th}$ PMOS transistors respectively mirroring the current in the main PMOS transistor to create a current having a predetermined amplitude.

6. The power supply of claim 1, wherein the first current adjusting unit includes switches each selecting the respective predetermined portion upper side current mirroring units from among the plurality of upper side current mirroring units according to the control signal.

7. The power supply of claim 1, wherein the first current adjusting unit includes first to $k^{th}$ switches each selecting the respective predetermined third to $n^{th}$ upper side current mirroring units from among the plurality of first to $n^{th}$ upper side current mirroring units according to the control signal, wherein k is two or more.

8. The power supply of claim 1, wherein the path switching circuit unit includes:
a charging switch connected between the first current adjusting unit and the power switch so as to switch the charging path on or off according to the path switching signal; and
a discharging switch connected between the power switch and the ground so as to switch the discharging path on or off according to the path switching signal.

9. A switched-mode power supply comprising:
a pulse width modulation (PWM) control unit generating a predetermined clock signal and varying pulse widths of the clock signal depending on a load so as to provide path switching signals, the path switching signals including first and second switch signals having opposite phases;
a clock counter counting the clock signal so as to generate a control signal having a predetermined number of bits;
a current source generating a predetermined current;
a current mirroring circuit unit connected to a first operating voltage terminal, and having a plurality of upper side current mirroring units respectively mirroring the current from the current source to create a current having a predetermined amplitude;
a first current adjusting unit individually selecting a portion of the plurality of upper side current mirroring units according to the control signal; and
a path switching circuit unit switched according to the first and second path switching signals so as to select a charging path between the first current adjusting unit and a power switch or a discharging path between the power switch and the ground,
wherein the first current adjusting unit periodically adjusts a current provided to the charging path according to the bits of the control signal.

10. The power supply of claim 9, wherein the current source includes:
a main PMOS transistor;
a constant-voltage circuit unit; and
a resistor circuit unit, wherein:
the main PMOS transistor has its source connected to the predetermined first operating voltage terminal, its drain connected to the constant-voltage circuit unit, and its gate connected to the current mirroring circuit unit;
the constant-voltage circuit unit is connected between the drain of the main PMOS transistor and the resistor circuit unit so as to generate a constant predetermined voltage; and
the resistor circuit unit has at least one resistor element connected between the constant-voltage circuit unit and the ground.

11. The power supply of claim 10, wherein the plurality of upper side current mirroring units of the current mirroring circuit unit includes first to $n^{th}$ PMOS transistors respectively mirroring the current in the main PMOS transistor to create a current having a predetermined amplitude.

12. The power supply of claim 9, wherein the first current adjusting unit includes switches each selecting the respective predetermined portion upper side current mirroring units from among the plurality of upper side current mirroring units according to the control signal.

13. The power supply of claim 9, wherein the first current adjusting unit includes first to $k^{th}$ switches each selecting the respective predetermined third to $n^{th}$ upper side current mirroring units from among the plurality of first to $n^{th}$ upper side current mirroring units according to the control signal, wherein k is two or more.

14. The power supply of claim 9, wherein the path switching circuit unit includes:
a charging switch connected between the first current adjusting unit and the power switch so as to switch the charging path on or off according to the path switching signal; and
a discharging switch connected between the power switch and the ground so as to switch the discharging path on or off according to the path switching signal.

15. A switched-mode power supply comprising:
a pulse width modulation (PWM) control unit generating a predetermined clock signal and varying pulse widths of the clock signal depending on a load to provide a path switching signal;
a clock counter counting the clock signal to generate a control signal;
a current source generating a predetermined current;
a current mirroring circuit unit connected to a first operating voltage terminal, and having a plurality of upper side current mirroring units respectively mirroring the current from the current source to create a current having a predetermined amplitude;

a first current adjusting unit individually selecting some of the plurality of upper side current mirroring units according to the control signal;

a path switching circuit unit switched according to the path switching signal so as to select a charging path between the first current adjusting unit and a power switch or a discharging path connected to the power switch;

a second current adjusting unit individually selecting a portion of a plurality of current paths connected to the discharging path in parallel according to the control signal; and a current generating unit connected between the second current adjusting unit and the ground, and having a plurality of lower side current mirroring units respectively mirroring the current in the current mirroring circuit unit to create an equal current.

16. The power supply of claim 15, wherein the PWM control unit varies the pulse width of the clock signal depending on the load so as to provide a first path switching signal, and provides a second path switching signal having an opposite phase to the first path switching signal.

17. The power supply of claim 15, wherein the clock counter counts the pulses of the clock signal so as to generate the control signal having a predetermined number of bits.

18. The power supply of claim 15, wherein the current source includes:
 a main PMOS transistor;
 a constant-voltage circuit unit; and
 a resistor circuit unit, wherein:
  the main PMOS transistor has its source connected to the predetermined first operating voltage terminal, its drain connected to the constant-voltage circuit unit, and its gate connected to the current mirroring circuit unit;
  the constant-voltage circuit unit is connected between the drain of the main PMOS transistor and the resistor circuit unit so as to generate a constant predetermined voltage; and
  the resistor circuit unit has at least one resistor element connected between the constant-voltage circuit unit and the ground.

19. The power supply of claim 18, wherein the plurality of upper side current mirroring units of the current mirroring circuit unit includes first to nth PMOS transistors respectively mirroring the current in the main PMOS transistor to create a current having a predetermined amplitude.

20. The power supply of claim 15, wherein the first current adjusting unit includes switches each selecting the respective predetermined portion upper side current mirroring units from among the plurality of upper side current mirroring units according to the control signal.

21. The power supply of claim 15, wherein the first current adjusting unit includes first to $k^{th}$ switches each selecting the respective predetermined third to $n^{th}$ upper side current mirroring units from among the plurality of first to $n^{th}$ upper side current mirroring units according to the control signal, wherein k is two or more.

22. The power supply of claim 15, wherein the path switching circuit unit includes:
 a charging switch connected between the first current adjusting unit and the power switch so as to switch the charging path on or off according to the path switching signal; and
 a discharging switch connected between the power switch and the current generating unit so as to switch the discharging path on or off according to the path switching signal.

23. The power supply of claim 15, wherein the second current adjusting unit includes switches each selecting the respective predetermined portion lower side current mirroring units from among the plurality of lower side current mirroring units according to the control signal.

24. The power supply of claim 15, wherein the second current adjusting unit includes first to $k^{th}$ switches each selecting the respective predetermined third to $n^{th}$ lower side current mirroring units from among the plurality of first to $n^{th}$ lower side current mirroring units according to the control signal, wherein k is two or more.

25. The power supply of claim 19, wherein the current generating unit includes:
 a first NMOS transistor connected between a first PMOS transistor included in the current mirroring circuit unit and the ground;
 a second NMOS transistor connected between the path switching circuit unit and the ground so as to mirror the current in the first NMOS transistor; and
 third to $n^{th}$ NMOS transistors each connected between the respective first to $k^{th}$ switches of the second current adjusting unit and the ground, so as to mirror the current in the first NMOS transistor.

26. A switched-mode power supply comprising:
 a pulse width modulation (PWM) control unit generating a predetermined clock signal and varying pulse widths of the clock signal depending on a load to provide path switching signals, the path switching signals including first and second switch signals having opposite phases;
 a clock counter counting the clock to generate a control signal having a predetermined number of bits;
 a current source generating a predetermined current;
 a current mirroring circuit unit connected to a first operating voltage terminal, and having a plurality of upper side current mirroring units respectively mirroring the current from the current source to create a current having a predetermined amplitude;
 a first current adjusting unit individually selecting a portion of the plurality of upper side current mirroring units according to the control signal;
 a path switching circuit unit switched according to the path switching signal so as to select a charging path between the first current adjusting unit and a power switch or a discharging path connected to the power switch;
 a second current adjusting unit individually selecting a portion of a plurality of current paths connected to the discharging path in parallel according to the control signal; and
 a current generating unit connected between the second current adjusting unit and the ground, and having a plurality of lower side current mirroring units respectively mirroring the current in the current mirroring circuit unit to create an equal current,
 wherein the first current adjusting unit periodically adjusts a current provided to the charging path according to the bits of the control signal, and the second current adjusting unit operates in synchronization with the first current adjusting unit according to the bits of the control signal, and periodically adjusts a current provided to the discharging path.

27. The power supply of claim 26, wherein the current source includes:
 a main PMOS transistor;
 a constant-voltage circuit unit; and
 a resistor circuit unit, wherein:
  the main PMOS transistor has its source connected to the predetermined first operating voltage terminal, its drain connected to the constant-voltage circuit unit, and its gate connected to the current mirroring circuit unit;

the constant-voltage circuit unit is connected between the drain of the main PMOS transistor and the resistor circuit unit so as to generate a constant predetermined voltage; and the resistor circuit unit has at least one resistor element connected between the constant-voltage circuit unit and the ground.

28. The power supply of claim 26, wherein the plurality of upper side current mirroring units of the current mirroring circuit unit includes first to $n^{th}$ PMOS transistors respectively mirroring the current in the main PMOS transistor to create a current having a predetermined amplitude.

29. The power supply of claim 26, wherein the first current adjusting unit includes switches each selecting the respective predetermined portion upper side current mirroring units from among the plurality of upper side current mirroring units according to the control signal.

30. The power supply of claim 26, wherein the first current adjusting unit includes first to $k^{th}$ switches each selecting the respective predetermined third to $n^{th}$ upper side current mirroring units from among the plurality of first to $n^{th}$ upper side current mirroring units according to the control signal, wherein k is two or more.

31. The power supply of claim 26, wherein the path switching circuit unit includes:

a charging switch connected between the first current adjusting unit and the power switch so as to switch the charging path on or off according to the path switching signal; and a discharging switch connected between the power switch and the second current adjusting unit so as to switch the discharging path on or off according to the path switching signal.

32. The power supply of claim 26, wherein the second current adjusting unit includes switches each selecting the respective predetermined portion lower side current mirroring units from among the plurality of lower side current mirroring units according to the control signal.

33. The power supply of claim 26, wherein the second current adjusting unit includes first to $k^{th}$ switches each selecting the respective predetermined third to $n^{th}$ lower side current mirroring units from among the plurality of first to $n^{th}$ lower side current mirroring units according to the control signal, wherein k is two or more.

34. The power supply of claim 28, wherein the current generating unit includes:

a first NMOS transistor connected between a first PMOS transistor included in the current mirroring circuit unit and the ground;

a second NMOS transistor connected between the path switching circuit unit and the ground so as to mirror the current in the first NMOS transistor; and third to $n^{th}$ NMOS transistors each connected between the respective first to $k^{th}$ switches of the second current adjusting unit and the ground, so as to mirror the current in the first NMOS transistor.

* * * * *